United States Patent
Sedigh et al.

(10) Patent No.: US 6,693,042 B1
(45) Date of Patent: Feb. 17, 2004

(54) METHOD FOR ETCHING A DIELECTRIC LAYER FORMED UPON A BARRIER LAYER

(75) Inventors: Mehran G. Sedigh, Campbell, CA (US); Jianmin Qiao, Fremont, CA (US); Sam Geha, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 39 days.

(21) Appl. No.: 09/752,539

(22) Filed: Dec. 28, 2000

(51) Int. Cl.$^7$ ............................................. H01L 21/302
(52) U.S. Cl. .................... 438/714; 438/720; 438/740; 438/723; 438/724; 438/701
(58) Field of Search ................. 438/720, 740, 438/723, 724, 701, 714

(56) References Cited

U.S. PATENT DOCUMENTS

| | | | | |
|---|---|---|---|---|
| 5,468,342 A | * | 11/1995 | Nulty et al. | 156/643.1 |
| 5,562,801 A | | 10/1996 | Nulty | |
| 5,911,887 A | * | 6/1999 | Smith et al. | 216/72 |
| 6,016,012 A | * | 1/2000 | Chatila | 257/775 |
| 6,074,959 A | * | 6/2000 | Wang et al. | 438/738 |
| 6,127,070 A | | 10/2000 | Yang et al. | |
| 6,228,774 B1 | * | 5/2001 | Marquez | 438/710 |

* cited by examiner

*Primary Examiner*—George Goudreau
(74) *Attorney, Agent, or Firm*—Kevin L. Daffer; Conley Rose P.C.

(57) ABSTRACT

A method for etching a dielectric layer formed upon a barrier layer with an etch chemistry including $C_xH_yF_z$, in which $x \geq 2$, $y \geq 2$, and $z \geq 2$ is provided. Such an etch chemistry may be selective to the barrier layer. For example, the etch chemistry may have a dielectric layer:barrier layer selectivity of at least approximately 20:1, but may range from approximately 20:1 to approximately 50:1. Therefore, etching a dielectric layer with such an etch chemistry may terminate upon exposing an upper surface of the barrier layer. As such, a thickness of a barrier layer used to protect an underlying layer may be reduced to, for example, approximately 100 angstroms to approximately 150 angstroms. In addition, critical dimensions of contact openings formed with such an etch chemistry may be substantially uniform across a wafer. Furthermore, critical dimensions of contact openings formed with such an etch chemistry may be uniform from wafer to wafer.

16 Claims, 3 Drawing Sheets

METHOD FOR ETCHING A DIELECTRIC LAYER FORMED UPON A BARRIER LAYER

BACKGROUND OF THE INVENTION

1. Field of the Invention

This invention relates to semiconductor device manufacturing, and more particularly, to improved methods for etching openings in intermetallic insulating layers and a semiconductor device with a thin barrier layer and well-defined contact openings.

2. Description of the Related Art

The following descriptions and examples are not admitted to be prior art by virtue of their inclusion within this section.

In the fabrication of semiconductor devices, numerous conductive device regions such as transistors, capacitors, and diodes may be formed on or above a semiconductor substrate. For example, a typical metal oxide semiconductor (MOS) transistor such as a NMOS or PMOS transistor generally includes a gate electrode formed above a substrate separated by a relatively thin gate dielectric. Conductive regions and layers of the device may be isolated from one another by an interlevel dielectric. At various stages in the fabrication of semiconductor devices, it may be necessary to form openings in an interlevel dielectric layer to allow contact to underlying regions or layers. Generally, an opening through a dielectric layer exposing a diffusion region or an opening through a dielectric layer between polysilicon and a first metal layer is called a "contact opening" or a "contact hole." An opening in other dielectric layers such as an opening through an interlevel dielectric layer is referred to as a "via." For purposes of this disclosure, henceforth "contact opening" may be used to refer to a contact opening and/or a via. A contact opening may expose a diffusion region within a silicon substrate such as a source or drain, or may expose some other layer or structure such as an underlying metallization layer, a local interconnect layer, or a gate structure. Conductive contact structures may be formed within the contact opening, and interconnects may overlie the contact structures and may connect neighboring contact structures.

To form such a contact opening, a masking layer having openings therethrough may be formed over the dielectric layer. In most modern processes, a dry etch may then be performed in which the wafer may be exposed to a plasma. The plasma may be formed by flowing one or more gases such as one or more halocarbons and/or one or more other halogenated compounds such as $CF_4$, $CHF_3$, $C_4F_8$, $C_5F_8$, $C_4F_6$ (Freon 23), $SF_6$, and $NF_3$. In addition, gases such as $O_2$, Ar, and $N_2$ may also be added to the gas flow. After the opening has been formed thereby exposing a portion of the region or layer to be contacted, the opening may be cleaned with a sputter etch such as a radio-frequency sputter etch. The sputter etch may be used to remove small amounts of material which may form on sidewalls or on a bottom surface of the contact opening during the dry etch process. The opening may then be filled with a conductive material so that electrical contact can be made with the underlying region or layer.

There are, however, several disadvantages to conventional methods for forming contact structures. For example, a contact opening may be etched through a dielectric layer to an underlying layer, such as a semiconductor substrate or metal interconnect layer. In this manner, an underlying layer may be exposed to the etch chemistry used to etch the dielectric. Unfortunately, an undesirable compound may be formed on the upper surface of the underlying layer when the underlying layer is exposed to the etch chemistry. For example, exposing an underlying aluminum layer to an etch chemistry which includes a fluorinated hydrocarbon may cause formation of aluminum fluoride on the upper surface of the underlying layer. Other underlying layers may also react with fluorinated hydrocarbons of an etch chemistry to form undesirable compounds. Such compounds may often be very difficult, if not impossible, to remove by conventional methods. In addition, attempts to remove such compounds may adversely affect the operation or structure of the device if, for example, damage to other dielectric or conductive features of the device is caused during removal of these compounds. Furthermore, if such compounds remain in an etched contact opening, the resistance of a contact structure formed in the opening may be adversely increased thereby causing device malfunction.

To etch a contact opening without destroying an underlying layer as described above, a barrier layer may be formed between the underlying layer and the dielectric layer. A barrier layer material may be selected such that the barrier layer does not react with the etch chemistry to form the undesirable compounds described above. A thickness of the barrier layer may depend on the etch rate of the etch chemistry. For example, depending on the rate at which the barrier layer is removed by the etch chemistry, a thickness of the barrier layer may be selected such that the barrier layer is not completely removed during the etch process. Therefore, a thickness of the barrier layer may be selected such that etching may be terminated before the underlying layer is exposed to the etch chemistry. In this manner, a contact opening may be formed through the dielectric layer without destroying the underlying layer. There are, however, several disadvantages to using such a barrier layer for forming a contact structure. For example, processing time for forming such a barrier layer may be heavily dependent upon the thickness of the barrier layer required to protect the underlying layer. In addition, due to the etch rate of typical barrier layer materials using conventional etch chemistries, the thickness of the barrier layer required to protect an underlying layer may be approximately 500 angstroms to approximately 1000 angstroms. Therefore, forming such a barrier layer may increase overall processing time, thereby reducing overall throughput and efficiency of semiconductor device manufacturing processes. Furthermore, overall cost of a semiconductor device may increase due to the expensive nature of barrier layer materials.

Although protecting the underlying layer during the process of etching a contact opening is important, forming contact openings of uniform critical uniformity across a wafer is also important. "Critical dimension", as used in this application, may generally refer to the dimensional design value of a feature. Critical dimensions are of interest since they may represent the smallest dimension that may be formed on a semiconductor topography using various techniques such as photolithography and etch. Unfortunately, as the dimensions of advanced semiconductor devices are reduced, problems associated with forming contact openings having uniform critical dimensions across a wafer typically increase. For example, current etch processes may not form contact openings of uniform critical dimensions across a wafer. As such, the critical dimensions of the contact openings across the wafer may vary. Furthermore, the critical dimensions of contact openings may also vary from wafer to wafer.

Accordingly, it would be advantageous to develop a method for forming contact openings through a dielectric layer using a barrier layer of reduced thickness to protect underlying semiconductor or metal interconnect layers while forming contact openings of uniform critical dimension across the wafer.

SUMMARY OF THE INVENTION

The problems outlined above may be in large part addressed by a method for etching a dielectric layer formed upon a barrier layer with an etch chemistry including $C_xH_yF_z$, in which $x \geq 2$, $y \geq 2$, and $z \geq 2$. For example, $C_xH_yF_z$ may include $C_2H_2F_4$, which may be commonly referred to as Freon 134 or F134. In addition, $C_xH_yF_z$ may also be a heavier fluorinated hydrocarbon such as $C_4H_2F_6$. Such an etch chemistry may be selective to the barrier layer. The selectivity of an etch chemistry or etch process may be generally defined as the ratio of the etch rates of different materials which are being etched. For example, the etch chemistry may have a dielectric layer:barrier layer selectivity of at least approximately 20:1, but may range from approximately 20:1 to approximately 50:1. Therefore, etching a dielectric layer with such an etch chemistry may terminate upon exposing an upper surface of the barrier layer. As such, a thickness of a barrier layer used to protect an underlying layer may be reduced to, for example, approximately 100 angstroms to approximately 150 angstroms. In addition, critical dimensions of contact openings formed with such an etch chemistry may be substantially uniform across a wafer. Furthermore, contact openings formed with such an etch chemistry may have uniform critical dimensions from wafer to wafer.

According to an embodiment, a conductive layer may be formed upon a semiconductor layer. The semiconductor layer may be a semiconductor substrate such as a monocrystalline silicon semiconductor substrate. Alternatively, the semiconductor layer may include various structures on another level of a semiconductor device. The semiconductor layer may also include diffusion or isolation regions, which may be formed in the semiconductor layer. A conductive layer such as aluminum, copper, or polysilicon may be formed upon the semiconductor layer. A barrier layer, which may include a metal such as titanium or a metal alloy such as titanium nitride (TiN), titanium tungsten (TiW), tantalum (Ta), or tantalum nitride (TaN) may be formed upon the conductive layer. The barrier layer and the conductive layer may then be used to form a metallization layer or any number of gate structures or local interconnect structures on and laterally spaced across the semiconductor layer.

A layer of dielectric material may then be formed upon and in contact with the metallization layer or formed structures and the semiconductor layer. The dielectric layer may be an interlevel dielectric layer such that the dielectric layer may insulate conductive structures on multiple levels of a semiconductor topography. The dielectric layer may be a material sufficient to insulate laterally adjacent structures such as local interconnects or gate electrodes. For example, appropriate dielectric materials may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). The dielectrics may be deposited by physical deposition such as sputtering or by a variety of chemical deposition methods and chemistries such as chemical vapor deposition. Additionally, the dielectrics may be undoped or may be doped, for example, with boron, phosphorus, boron and phosphorus, or fluorine, to form a doped dielectric layer such as borophosphosilicate glass (BPSG), phosphosilicate glass (PSG), and fluorinated silicate glass (FSG).

The dielectric layer may be etched with an etch chemistry in regions of the dielectric layer which have been exposed by patterning an overlying etch mask layer. An etch chemistry may be flowed in the form of a gas such that a dry etch process may be utilized. In a dry etch process, a semiconductor topography may be exposed to a plasma formed by flowing gases of the etch chemistry to etch exposed portions of a dielectric layer. Etching the dielectric layer may involve removing the dielectric layer from an upper surface of the dielectric layer to a level which may be approximately coplanar with an upper surface of the barrier layer. As such, etching the dielectric layer may include exposing a surface of the barrier layer. In addition, etching the dielectric layer may terminate upon exposing an upper surface of the barrier layer. Etching the dielectric layer may be a timed process based on experimental data. Alternatively, etching the dielectric layer may involve stopping the etch process after an endpoint has been detected because etching the dielectric layer may involve removing the dielectric layer to the barrier layer. In this manner, an etched structure such as a contact opening may be formed from an upper surface of the dielectric layer to an upper surface of the barrier layer which may be used to form a contact structure.

The etch chemistry as described herein may include $C_2H_2F_4$ and other halogenated compounds such as $CF_4$, $CHF_3$, $C_2F_6$, $C_4F_8$, $C_5F_8$, $C_4F_6$, $SF_6$, and $NF_3$. In addition, gases such as $O_2$, Ar, $N_2$, or He may be added to the etch chemistry. For example, an etch chemistry may include a combination of $C_2H_2F_4$, $CF_4$, and/or $CHF_3$ as reactive etchant gases, and Ar and/or $N_2$ as carrier/inert etchant gases for etching a dielectric layer. However, an appropriate etch chemistry may depend on, for example, the dielectric layer being etched, the stage of processing, the etch tool being used, the desired etch characteristics, such as etch rate and selectivity, and the desired properties of the feature being formed such as critical dimension and sidewall angle. Furthermore, a ratio of the etchant gases in an etch chemistry may be selected to optimize barrier layer selectivity and critical dimension uniformity. For example, an etch chemistry as described in the above embodiments may have a $C_xH_yF_z:(CF_4, CHF_3)$ ratio of approximately 2:3.5 to approximately 2:4. However, an appropriate $C_xH_yF_z:(CF_4, CHF_3)$ ratio may also vary depending on process conditions used for etching the dielectric layer.

A semiconductor device formed by the previously described method is also contemplated herein. The semiconductor device may include a barrier layer spaced above a semiconductor layer by a conductive layer. The barrier layer and the conductive layer may form gate structures, local interconnects, or a metallization layer. The barrier layer may have a thickness of approximately 70 angstroms to approximately 150 angstroms, or more preferably approximately 100 angstroms to approximately 150 angstroms. A dielectric layer may be formed upon and in contact with the barrier layer. In addition, a contact opening may be formed in the dielectric layer. The contact opening may be formed by etching the dielectric layer with an etch chemistry including $C_2H_2F_4$. The contact opening may be filled with a conductive material to form a contact structure. Furthermore, interconnects may overlie the contact structure to connect to neighboring contact structures.

Etching a dielectric layer with an etch chemistry including $C_xH_yF_z$, in which $x \geq 2$, $y \geq 2$, and $z \geq 2$ may provide several advantages over standard methods for etching a dielectric layer. For example, an entire dielectric layer may be etched with the etch chemistry stopping on a barrier layer of reduced thickness without removing the barrier layer to expose the underlying layer. Because the etch chemistry may be significantly more selective to the barrier layer than to the dielectric layer, the etch chemistry may be used to rapidly etch an entire thickness of the dielectric layer. The etch chemistry, however, may etch the barrier layer at a significantly slower etch rate than the etch rate of the dielectric layer. Therefore, etching with the etch chemistry may be stopped before an entire barrier layer of reduced thickness has been removed such that the underlying layer may not be exposed to the etch chemistry. In this manner, a significant portion of the barrier layer may remain after etching the dielectric layer to protect the underlying layer. More specifically, the barrier layer may prevent the formation of undesirable compounds upon the upper surface of the underlying layer, thereby preventing an increase in resistance within conductive structures formed within the etched dielectric layer.

Consequently, the thickness of a barrier layer within a semiconductor device may be reduced to approximately 70 angstroms to approximately 150 angstroms, or more preferably approximately 100 angstroms to approximately 150 angstroms, in which the etch chemistry is used to etch a dielectric layer. In contrast, standard methods for etching a dielectric layer may typically require a barrier layer having a thickness of approximately 500 angstroms to approximately 1000 angstroms to protect the underlying layer. The formation of a barrier layer of reduced thickness may provide several advantages for the fabrication of a semiconductor device. For example, fabrication process time may be reduced. A barrier layer having a thickness of approximately 500 angstroms to approximately 1000 angstroms may take approximately 6 minutes to approximately 8 minutes to deposit. In contrast, a barrier layer of approximately 100 angstroms to approximately 150 angstroms may only require approximately 30 seconds to approximately 45 seconds to deposit. Therefore, reducing the thickness of a barrier layer may significantly reduce process time and may significantly increase production throughput and efficiency. Furthermore, barrier layer materials may typically be expensive and reducing a thickness of the barrier layer may provide a substantial reduction in the cost of fabricating a semiconductor device.

In addition, etching a dielectric layer with an etch chemistry including $C_2H_2F_4$, may promote formation of a layer of a passivating polymer within the etched contact opening. Because etch processing conditions may be selected such that the etchant ions may reach the semiconductor substrate at a substantially perpendicular angle, the layer of passivating polymer may be sufficiently removed from bottom surface within the contact opening. In this manner, etching may not be prematurely stopped by polymer buildup within the contact opening. The sidewalls of the contact openings, however, may not be subjected to sufficient bombardment by the etchant ions such that the layer of polymer may not be removed. The layer of polymer may serve to further protect the sidewalls of the contact opening from etchant ions, which may be directed toward the sidewalls of the contact opening and which may cause the sidewall angle to deviate from a perpendicular angle. After termination of the etch process, polymer formed upon sidewall surfaces of the contact openings may be removed by using a wet etch process prior to any further processing. Therefore, although an initial thickness of a dielectric layer may vary across a wafer or from wafer to wafer, the lateral dimensions of contact opening may be substantially uniform from chip to chip on a wafer and from wafer to wafer. Consequently, using such an etch chemistry to etch a dielectric layer may be used to form semiconductor devices having substantially uniform critical dimensions.

BRIEF DESCRIPTION OF THE DRAWINGS

Other objects and advantages of the invention will become apparent upon reading the following detailed description and upon reference to the accompanying drawings in which.

Figure 1:
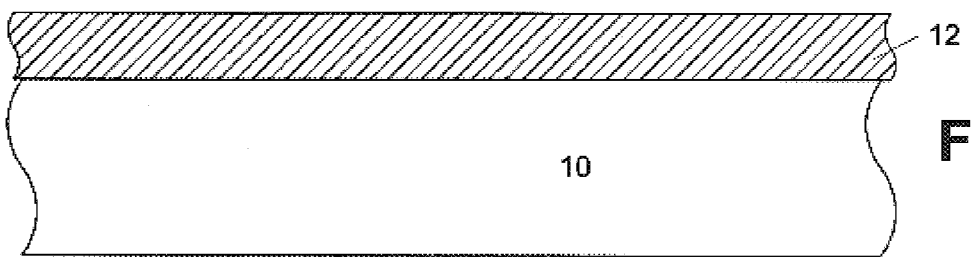
FIG. 1 depicts a partial cross-sectional view of a semiconductor topography in which a conductive layer is formed upon a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for etching a dielectric layer is shown in FIGS. 1–8. FIG. 1 depicts a semiconductor topography in which conductive layer 12 has been formed upon and in contact with semiconductor layer 10. Semiconductor layer 10 may preferably be a silicon substrate, and may be doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. Alternatively, the semiconductor layer may include various semiconductor structures on another level of a semiconductor device. A dielectric layer (not shown) may also be formed upon semiconductor layer 10 such that a dielectric layer may be interposed between semiconductor layer 10 and conductive layer 12. In addition, diffusion regions (not shown) and isolation regions (not shown) may also be formed in semiconductor layer 10. For example, diffusion regions may be lightly doped drain regions and heavily doped source/drain regions formed in the semiconductor layer adjacent to gate structures formed upon the semiconductor-layer. Isolation regions may be field oxide regions such as regions of undoped silicon dioxide which may serve to isolate separate active regions on the semiconductor layer from one another. Isolation regions may be formed by a number of techniques such as shallow trench isolation (STI), recessed oxide isolation (ROI), or local oxidation of silicon (LOCOS).

Conductive layer 12 may include conductive structures such as gate structures or local interconnects formed upon and laterally spaced across semiconductor layer 10. Conductive layer 12 may also be a metallization layer. Appropriate materials for conductive layer 12 may include aluminum, an aluminum alloy such as an alloy of aluminum and copper, copper, and polysilicon. For example, aluminum may be deposited by physical vapor deposition (PVD) using an aluminum target. A chemical vapor deposition (CVD) process may also be used to deposit aluminum by the pyrolysis of triisobutyl aluminum (TIBA) in a reactor chamber maintained at a temperature of approximately 250° C. and a pressure less than approximately 1 torr. Polysilicon may be deposited by using a CVD process involving deposition of silicon from a silane source. In addition, conductive layer 12 may be deposited using a technique such as atmospheric pressure chemical vapor deposition (APCVD), low pressure chemical vapor deposition (LPCVD), plasma-enhanced chemical vapor deposition (PECVD), and conventional sputtering. In an embodiment in which conductive layer 12 is a metallization layer, a thickness of conductive layer 12 may be approximately 1000 Å to approximately 10,000 Å, preferably approximately 2000 Å to approximately 8000 Å or more preferably approximately 3000 Å to approximately 6000 Å. However, in an embodiment in which conductive layer 12 is subsequently formed as an interconnect structure, a thickness of conductive layer 12 may be approximately 300 Å to approximately 5000 Å, preferably approximately 500 Å to approximately 3000 Å or more preferably approximately 1000 Å to approximately 2500 Å. Nevertheless, conductive layer 12 may also be larger or smaller depending on the semiconductor device which is being formed.

Furthermore, because copper diffuses readily through silicon and oxide, and undesirably alters the electrical properties of transistors formed in silicon, a liner may be deposited on the semiconductor layer before deposition of a copper layer. A liner may preferably be formed from a conductive material which acts as a diffusion barrier to the overlying copper, and also adheres well to semiconductor layer 10. Materials typically used as a liner, which is often called a diffusion barrier and/or an adhesion layer, may include metal nitrides such as titanium nitride and tantalum nitride, and refractory alloys such as titanium-tungsten. Conductive layer 12 may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing a copper layer, but other techniques, including CVD, may be used as well.

Figure 2:
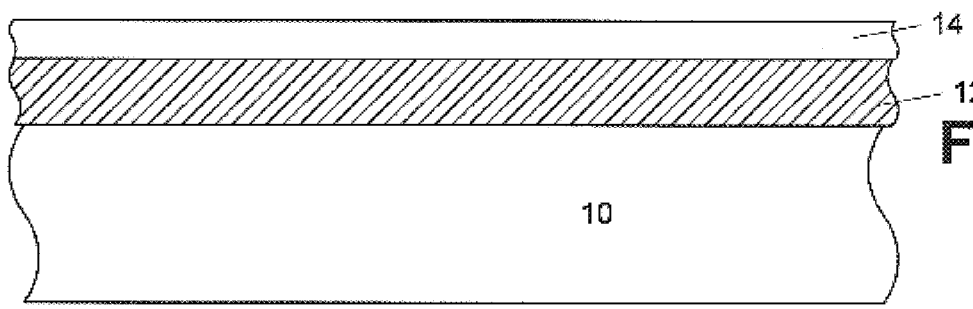
FIG. 2 depicts a partial cross-sectional view of a semiconductor topography in which a barrier layer is formed upon a conductive layer subsequent to FIG. 1.

FIG. 2 depicts conformal barrier layer 14 formed upon and in contact with conductive layer 12. Barrier layer 14 may include a metal or a metal alloy. For example, appropriate materials for barrier layer 14 may include titanium, titanium nitride (TiN), titanium tungsten (TiW), tantalum (Ta), and tantalum nitride (TaN). Barrier layer 14 may be deposited conformally using various techniques such as chemical vapor deposition (CVD), atmospheric pressure chemical vapor deposition (APCVD), low pressure chemical vapor deposition (LPCVD), plasma-enhanced chemical vapor deposition (PECVD), or physical vapor deposition (PVD). A thickness of barrier layer 14 may be approximately 70 Å to approximately 150 Å or more preferably approximately 100 angstroms to approximately 150 angstroms. However, barrier layer 14 may also be larger or smaller depending on the semiconductor device which is being formed. Thicknesses in the above range are believed to be sufficient to avoid etching through the barrier layer when using the etching technique described herein. A layer of photoresist material (not shown) may be subsequently formed upon the barrier layer and patterned such that portions of the barrier layer are exposed. As such, exposed portions of the barrier layer and the conductive layer may be removed by an etch process to form local interconnect structures or gate structures. The photoresist material may be also be stripped following the formation of the structures. The barrier layer may also serve as a diffusion barrier layer to inhibit atoms of adjacent layers from diffusing into each other.

Figure 3:
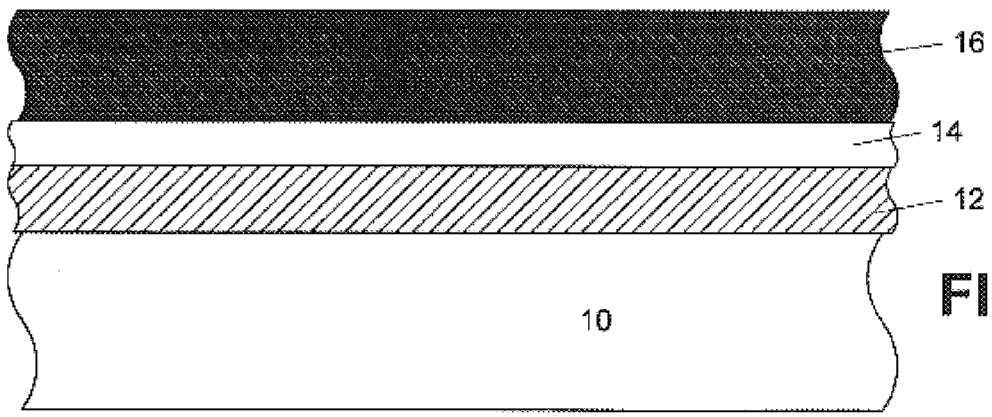
FIG. 3 depicts a partial cross-sectional view of a semiconductor topography in which a dielectric layer is formed upon a barrier layer subsequent to FIG. 2.

As shown in FIG. 3, a dielectric layer may be formed upon barrier layer 14 and subsequently planarized to form dielectric layer 16. Dielectric layer 16 may include a pre-metal dielectric layer or an interlevel dielectric layer. For example, dielectric layer 16 may include silicon dioxide ($SiO_2$), tetraorthosilicate glass (TEOS), silicon nitride ($Si_xN_y$), silicon oxynitride ($SiO_xN_y(H_z)$), or silicon dioxide/silicon nitride/silicon dioxide (ONO). In addition, dielectric layer 16 may be silicon dioxide deposited by a CVD process, which may be nitrided in a subsequent processing step. Silicon nitride and silicon oxynitride may be formed by a CVD process using a silicon source, such as silane, chlorosilane ($SiH_xCl_y$), or dichlorosilane ($SiCl_2H_2$), and a nitrogen source, such as nitrogen ($N_2$), nitrous oxide ($N_2O$), and ammonia ($NH_3$). Deposition of silicon nitride may be performed at a substrate temperature of about 600° C. to about 950° C., a deposition chamber pressure of approximately 5 mT to approximately 500 mT, and for a period of time of approximately 20 minutes to approximately 100 minutes. In addition, decomposition of tetraethyl orthosilicate (TEOS) may be performed in a plasma-enhanced CVD (PECVD) reactor at a substrate temperature of about 200° C. to about 500° C. to produce a very conformal film. Other techniques that may be used to deposit silicon dioxide for dielectric layer 16 may include PECVD using a silane source, atmospheric-pressure CVD (APCVD), and low-pressure CVD (LPCVD) using silane or TEOS sources. In addition, dielectric layer 16 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide.

Dielectric layer 16 may also be formed from, e.g., low doped BPSG, low doped PSG, FSG, or undoped silicon dioxide. Low doped BPSG may have a boron concentration of less than approximately 5% by weight. Low doped PSG may have a phosphorus concentration of less than approximately 6% by weight, and more preferably less than approximately 5% by weight. In an embodiment, dielectric layer 16 may be deposited by a high density plasma (HDP) deposition technique. A high density plasma may include a charge density that generally exceeds that used in conventional plasma enhanced and plasma assisted chemical vapor deposition (PECVD and PACVD). For example, a high density plasma may include a charge density that exceeds that which may be used to deposit conventional PECVD BPSG layers such as charge densities which may generally exceed approximately $10^7$ charged particles per $cm^3$.

In addition, a high density plasma may have a low frequency power in a range of approximately 4000 W to approximately 4500 W, and a high frequency power in a range of approximately 1200 W to approximately 1500 W. Furthermore, a HDP PSG layer may be formed from a plasma which may include a mixture of a silicon source such as silane or chlorosilane, an oxygen source such as oxygen, ozone, or nitrous oxide, and a phosphorus source such as phosphine, methyl phosphine, or ethyl phosphine. For example, a silicon source may flow into a plasma chamber at a rate of approximately 5 to 100 standard cubic centimeters per minute (sccm). An oxygen source may flow into the plasma chamber at a rate of approximately 20 sccm to approximately 1000 sccm, and a phosphorus source may flow into the plasma chamber at a rate of approximately 10 sccm to approximately 500 sccm. In addition, argon may also flow into the plasma chamber at a rate of approximately 25 sccm to approximately 40 sccm. The flow ratios of the silicon and phosphorus sources may be selected in a range from approximately 1:20 to approximately 1:2. Following deposition, dielectric layer 16 may be planarized to a level spaced above barrier layer 14 to provide a substantially planar upper surface of dielectric layer 16. Appropriate thicknesses for dielectric layer 16 may be approximately 1000 Å to approximately 5000 Å greater than the thickness of conductive layer 12. Consequently, the thickness of dielectric layer 16 preferably may be approximately 1500 Å to approximately 3000 Å or more preferably approximately 2000 Å to approximately 2500 Å greater than the thickness of conductive layer 12. Larger or smaller thicknesses of dielectric layer 16, however, may be appropriate depending on the semiconductor device being formed.

Figure 4:
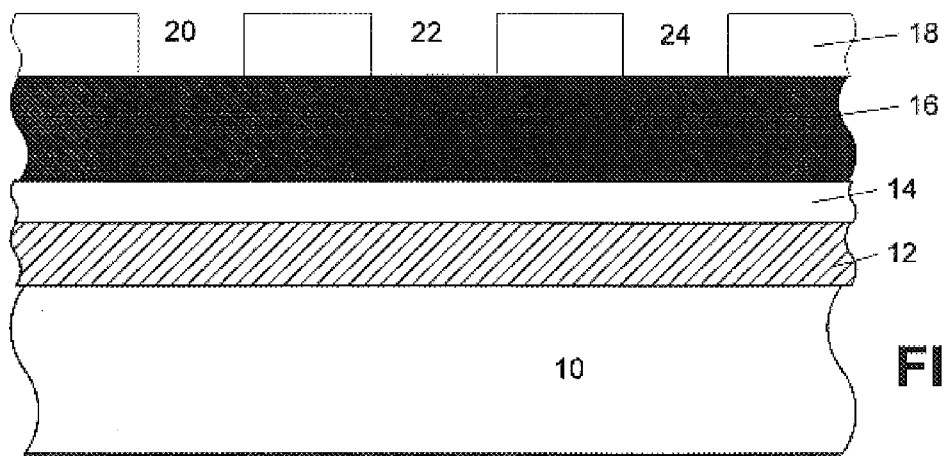
FIG. 4 depicts a partial cross-sectional view of a semiconductor topography in which a patterned masking layer is formed upon the dielectric layer subsequent to FIG. 3.

Masking layer 18 may be formed on the dielectric layer 16 as illustrated in FIG. 4 and may include a hard mask layer, a photoresist layer, or a combination of both. The hard mask may be an undoped silicon dioxide layer if dielectric layer 16 is a lightly doped or heavily doped dielectric material. In this manner, the hard mask layer may prevent outdiffusion from dielectric layer 16 during subsequent thermal processes and/or may prevent moisture from migrating into dielectric layer 16. The hard mask layer may also provide a more stable surface for subsequent layers, which may be formed upon the semiconductor topography. The conformal hard mask layer may be formed by decomposition of tetraethyl orthosilicate (TEOS) which may be performed in a plasma-enhanced CVD (PECVD) reactor at a substrate temperature in the range from about 200° C. to about 500° C. to produce a very conformal film. Other techniques that may be used to deposit silicon dioxide for the hard mask layer include PECVD using a silane source, and atmospheric-pressure CVD (APCVD) and low-pressure CVD (LPCVD) using silane or TEOS sources.

A layer of photoresist may be deposited upon the hard mask layer and patterned using a lithography technique. The patterned photoresist layer may be used as an etch mask such that exposed portions of the hard mask layer may be removed by using an etch technique to form masking layer 18. In this manner, portions of the hard mask layer underlying the patterned layer of photoresist may be protected during an etch process. As such, a pattern in the layer of photoresist may be transferred by an etch process to a hard mask layer thereby forming masking layer 18. Consequently, regions of the upper surface of dielectric layer 16 may be exposed for subsequent processing. As illustrated in FIG. 4, open regions 20, 22, and 24 of masking layer 18 expose portions of dielectric layer 16. Although three open regions are illustrated, any number of open regions may be formed upon and laterally spaced across dielectric layer 16. In addition, open regions 20, 22, and 24 may be of differing widths and lateral space dimensions.

In an embodiment, the patterned layer of photoresist may be removed subsequent to patterning the hard mask layer by using stripping processes such as a wet etch or reactive ion etch stripping process. Therefore, only the hard mask layer may be used as the etch mask layer in subsequent pattern transfer processes such as reactive ion etching or plasma etching. Alternatively, the hard mask layer may be eliminated, and the layer of photoresist may be formed and patterned upon dielectric layer 16. In this manner, the patterned layer of photoresist may be used as masking layer 18 in subsequent processing. As mentioned above, masking layer 18 may generically represent either a patterned hard mask layer, a patterned photoresist layer, or a combination of a patterned layer of photoresist upon a patterned hard mask layer.

Figure 5:
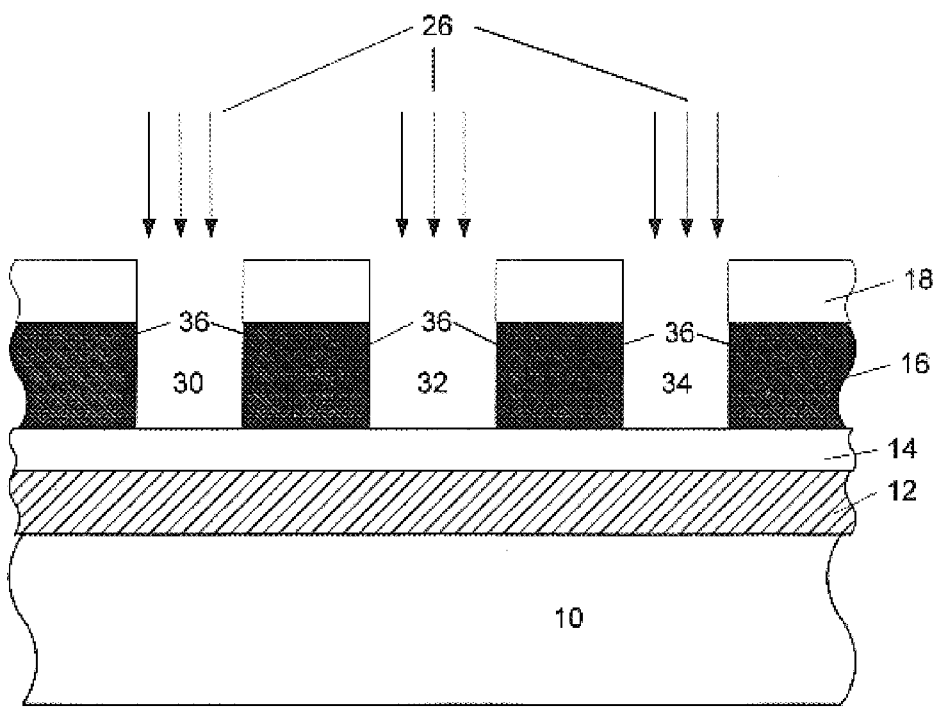
FIG. 5 depicts a partial cross-sectional view of a semiconductor topography in which exposed portions of the dielectric layer are removed subsequent to FIG. 4.

FIG. 5 illustrates the formation of openings 30, 32, and 34 in dielectric layer 16 in regions of the dielectric layer which are not protected by masking layer. 18. Although three openings are illustrated, any number of openings may be formed in the dielectric layer depending on the number of openings formed in the masking layer as describe above. Lateral boundaries of etched openings 30, 32, and 34 may be defined by opposing sidewall surfaces 36. Forming openings 30, 32, and 34 may include etching dielectric layer 16 with an etch chemistry (represented by arrows 26) which may include $C_xH_yF_z$ in which $x \geq 2$, $y \geq 2$, and $z \geq 2$. For example, $C_xH_yF_z$ may include $C_2H_2F_4$ or a heavier fluorinated hydrocarbon such has $C_4H_2F_6$. The etch chemistry may also include a number of additional fluorinated hydrocarbons and/or fluorinated carbon compounds such as $CHF_3$, $CF_4$, $C_2F_6$ $C_4F_8$, $C_5F_8$, and $C_4F_6$. In addition, the etch chemistry may include a number of other compounds such as $SF_6$ and $NF_3$. The etch chemistry may further include an inert gas such as argon or xenon. The ratio of etchant gases in the etch chemistry may vary depending on the etch tool and other process parameters such as chamber pressure. For example, an etch chemistry may have a $C_xH_yF_z$:($CF_4$, $CHF_3$) ratio of approximately 2:3.5 to approximately 2:4.

Such an etch chemistry may be selective to barrier layer 14. A selectivity of an etch chemistry or an etch process may be generally defined as the ratio of the etch rates of different materials. As such the selectivity for an etch chemistry may vary significantly depending on the materials which are being etched. For example, the etch chemistry may etch dielectric layer 16 at a very fast etch rate and may etch barrier layer 14 at a very slow etch rate. In this manner, the etch chemistry described above may have a dielectric layer to barrier layer selectivity of at least approximately 20:1 but may also have a dielectric to barrier layer selectivity of approximately 50:1. Therefore, the etch chemistry may be used to etch dielectric layer 16 from an upper surface of the dielectric layer to an upper surface of barrier layer 14. Etching may substantially terminate upon exposing the upper surface of the barrier layer. As such, etching may terminate before a substantial portion of the barrier layer 14 may be removed. In addition, such an etch chemistry may not adversely affect the selectivity of the photoresist layer with respect to the dielectric layer. For example, the etch chemistry may have a photoresist to dielectric layer selectivity of approximately 2:1 to approximately 4:1. Thus, the thickness of the photoresist and process parameters which may be used to apply the photoresist may remain similar to current applications. Therefore, a thickness of the photoresist layer which may be used as masking layer 18 may not need to be increased for etching dielectric layer 16 with such an etch chemistry.

An etch process may be defined by a number of process conditions. In an embodiment, for example, a flow rate for $C_2H_2F_4$ may be approximately 2 sccm to approximately 8 sccm. In addition, a flow rate for $CF_4$ may be approximately 10 sccm to approximately 60 sccm, and a flow rate for $CHF_3$ may be approximately 30 sccm to approximately 100 sccm. A flow rate for argon may be approximately 40 sccm to approximately 10 sccm. Furthermore, a flow rate for nitrogen may be approximately 5 sccm to approximately 25 sccm. Radio frequency power values for etching the first portion of the dielectric layer may be approximately 500 W to approximately 800 W. A pressure in the etch chamber may be approximately 50 mT to approximately 250 mT during processing. Additionally, a magnetic field within the etch chamber may be approximately 0 G to approximately 30 G. In addition, a temperature within the etch chamber may be approximately 10° C. to approximately 40° C. As such, this temperature may be approximately the temperature of the semiconductor substrate which is being etched. The semiconductor substrate may be situated on an electrostatic chuck within the etch chamber during processing. The chuck may be cooled by flowing helium across a surface of the chuck at a pressure of approximately 1 torr to approximately 50 torr. As such, the temperature of the semiconductor substrate which is being etched, may be altered by adjusting the pressure of helium which is following across the surface of the chuck. In addition, the etch process may be conducted by medium density or high density tools.

Figure 6:
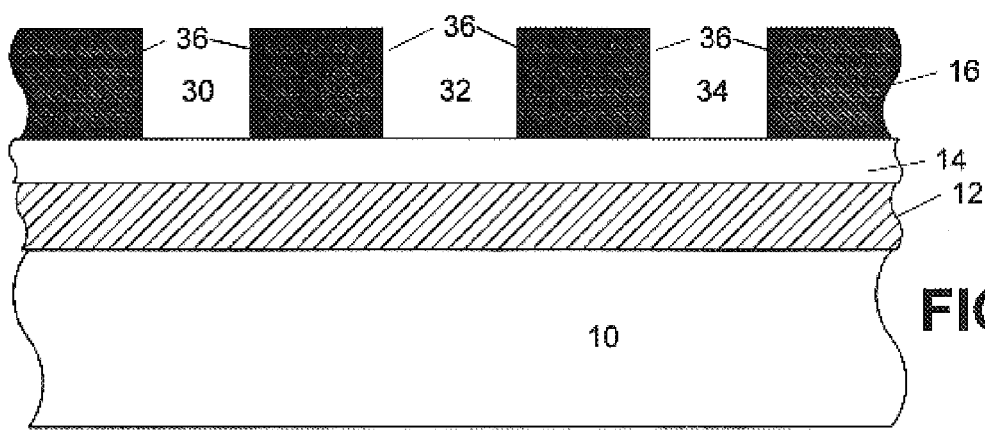
FIG. 6 depicts a partial cross-sectional view of a semiconductor topography in which the masking layer is removed subsequent to FIG. 5.

Subsequent to etching the dielectric layer, an additional etch step may be performed (not shown) to remove any residual dielectric material which may remain in the etched structure or to remove any contaminants which may have accumulated on the upper surface of the barrier layer during prior processing or handling. As shown in FIG. 6, masking layer 18 overlying portions of dielectric layer 16 may be removed subsequent to the etch process. For example, a photoresist layer may be removed from dielectric layer 16 by using a wet etch or plasma etch stripping process. In addition, a hard mask layer may be removed by a chemical-mechanical polishing process or an etch process. Alternatively, the masking layer may also be used as a masking layer for further processing and may remain on dielectric layer 16 subsequent to the etch process. In addition, an additional etch step may be performed subsequent to etching the dielectric layer to remove any residual dielectric material which may remain in the etched structure or to remove any contaminants which may have accumulated on the upper surface of the barrier layer during prior processing or handling.

Figure 7:
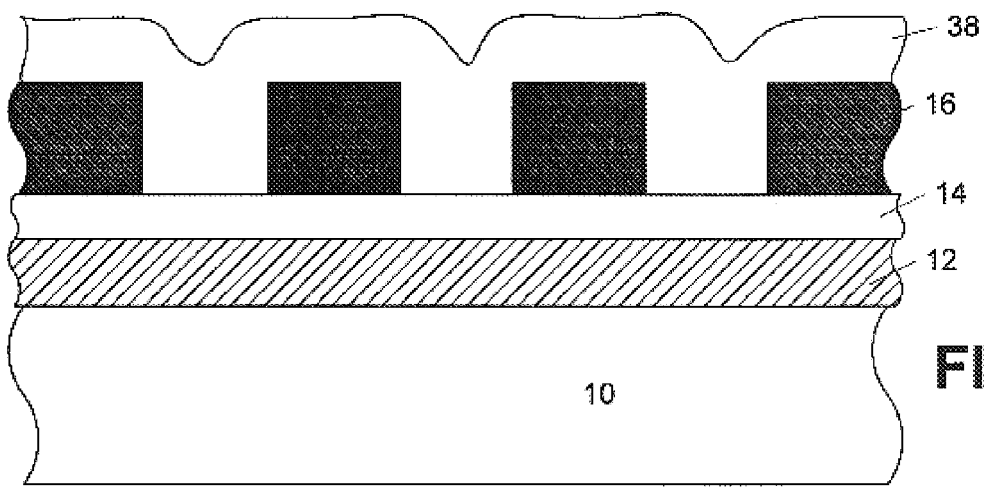
FIG. 7 depicts a partial cross-sectional view of a semiconductor topography in which a layer of conductive material is deposited upon the semiconductor topography subsequent to FIG. 6.

FIG. 7 illustrates formation of conductive layer 38 in openings 30, 32, and 34 and upon the upper surfaces of dielectric layer 16. Conductive layer 38 may be formed with a single deposition step in which a conductive material such as aluminum, tungsten, titanium, or appropriate alloys thereof are deposited into openings 30, 32, and 34. For example, a CVD process may be used to deposit aluminum by the pyrolysis of triisobutyl aluminum (TIBA) in a reactor chamber maintained at a temperature of approximately 250° C. and a pressure less than approximately 1 torr. In addition, conductive layer 38 may be deposited using a technique such as atmospheric pressure chemical vapor deposition (APCVD), low pressure chemical vapor deposition (LPCVD), plasma-enhanced chemical vapor deposition (PECVD), or physical vapor deposition (PVD).

Alternatively, conductive material layer 38 may be copper formed in openings 30, 32, and 34 and upon upper surface of dielectric layer 16. Because copper diffuses readily through silicon and oxide, and undesirably alters the electrical properties of transistors formed in silicon, a liner may be deposited into the openings before deposition of a copper layer. A liner may preferably be formed from a conductive material, which acts as a diffusion barrier to the overlying copper, and also adheres well to dielectric layer 16. Materials typically used as a liner, which is often called a diffusion barrier and/or an adhesion layer, may include metal nitrides such as titanium nitride and tantalum nitride, and refractory alloys such as titanium-tungsten as used with barrier layer 14. Conductive material layer 38 may be typically formed using two deposition steps. A thin "seed" layer may be deposited first, followed by a more rapid "fill" deposition. The seed layer may be deposited by sputtering, but other methods such as CVD may also be used. Electroplating is a currently preferred method of depositing the copper fill layer, but other techniques, including CVD, may be used as well.

An adhesion layer (not shown) may also be formed in openings 30, 32, and 34 and on the upper surface of dielectric layer 16 prior to formation of conductive material layer 38. For example, an adhesion layer may be formed by blanket depositing an adhesion material onto the sidewalls and bottom of openings 30, 32, and 34. Suitable adhesion materials include titanium (Ti), titanium-tungsten (TiW), titanium nitride (TiN), or tungsten silicides ($WSi_x$). Adhesion layers are typically required in those cases where conductive material layer 38 may adhere poorly to the material of dielectric layer 16. Adhesion layers are typically required, for example, to compensate for the poor adhesion characteristics of tungsten and some tungsten alloys to silicon dioxide dielectric films. After an adhesion layer has been formed, a conductive material layer may then be deposited on the adhesion layer as described above.

Figure 8:
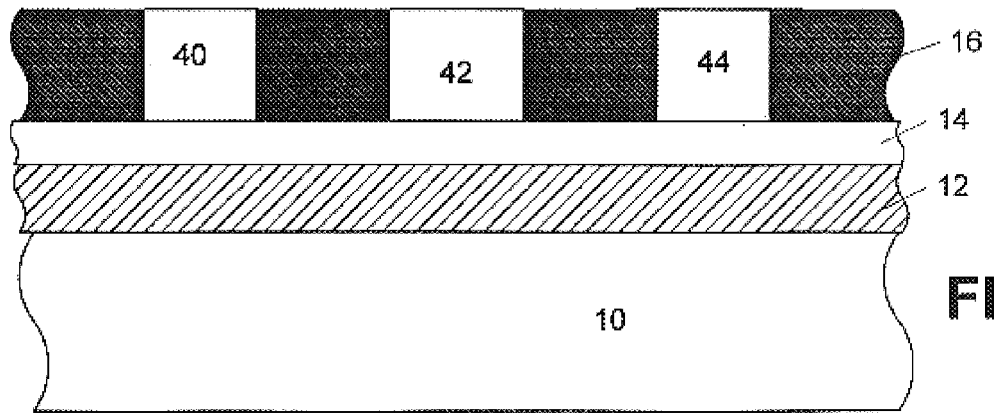
FIG. 8 depicts a partial cross-sectional view of a semiconductor topography in which the layer of conductive material is planarized.

FIG. 8 illustrates contact structures 40, 42, and 44 formed through dielectric layer 16 and in contact with an upper surface of barrier layer 14. A selective etch-back process may be used to remove conductive layer 38 from upper surfaces of dielectric layer 16. Alternatively or in addition, a chemical-mechanical polishing process may be used to remove conductive layer 38 from upper surfaces of dielectric layer 16. In this manner, an upper surface of conductive layer 38 may be substantially coplanar with an upper surface of dielectric layer 16. In addition, if an adhesion layer (not shown) is used to promote adhesion between conductive layer 38 and dielectric layer 16, then the adhesion layer may be removed from upper surfaces of dielectric layer 16 by using an etch or polishing technique. Subsequent processing may include forming additional levels of semiconductor structures such as interconnects upon upper surfaces of dielectric layer 16 and the contact structures 40, 42, and 44. Therefore, multiple levels of semiconductor structures may be interconnected to form a working semiconductor device.

FIG. 8 also illustrates a semiconductor device 46 which may be formed according to an above embodiment. Conductive layer 12 is formed upon semiconductor layer 10, and barrier layer 14 may be formed upon the conductive layer. Barrier layer 14 may have a thickness of approximately 70 angstroms to approximately 150 angstroms, and preferably approximately 100 angstroms to approximately 150 angstroms. The barrier layer and the conductive layer may form gate structures, local interconnects, or a metallization layer. For example, the barrier layer and the conductive layer may be patterned to form any number of local interconnects laterally spaced across semiconductor layer 10 which may overlie and connect neighboring contact structures. Dielectric layer 16 may be formed over and in contact with barrier layer 14. Dielectric layer 16 may also be formed over and in contact with semiconductor layer 10 if the barrier layer and the conductive layer are patterned as described above.

Contact structures 40, 42, and 44 may be formed within openings in dielectric layer 16. The openings may be formed in dielectric layer 16 by etching the dielectric layer with an etch chemistry which includes $C_2H_2F_4$. Therefore, according to an embodiment, contact structures 40, 42, and 44 of semiconductor device 46 may have substantially perpendicular sidewall surfaces 36, i.e. approximately a 90° sidewall angle with respect to semiconductor layer 10, across a height of the contact structures. In addition, contact structures 40, 42, and 44 may also have a uniform critical dimension of approximately 50 angstroms to approximately 5000 angstroms, preferably approximately 70 angstroms to 1000 angstroms, or more preferably approximately 100 angstroms to approximately 300 angstroms. Contact structures 40, 42, and 44 may be in electrical contact with barrier layer 14. In addition, contact structures may be 40, 42, and 44 may also be in electrical contact with additional conductive structures (not shown) which may be formed across an upper surface of dielectric layer 16 and/or an upper surface of contact structures 40, 42, and 44.

It will be appreciated to those skilled in the art having the benefit of this disclosure that this invention is believed to provide a method for etching a dielectric layer with an etch chemistry including $C_xH_yF_z$, in which $x \geq 2$, $y \geq 2$, and $z \geq 2$. Further modifications and alternative embodiments of various aspects of the invention will be apparent to those skilled in the art in view of this description. For example, the methods described herein could be applied not just to forming contact openings, but to forming any semiconductor feature which may include etching a feature through a dielectric material stopping on a material having an etch response which is similar to an etch response of a barrier layer. For example, the method described herein may be used in a dual damascene process in which an interconnect trench and a contact opening may be formed simultaneously in a dielectric layer. It is intended that the following claims be interpreted to embrace all such modifications and changes and, accordingly, the specification and drawings are to be regarded in an illustrative rather than a restrictive sense.

What is claimed is:

1. A method for forming a semiconductor device comprising etching a dielectric layer formed upon a barrier layer with an etch chemistry comprising $C_xH_yF_z$, wherein $x \geq 2$, $y \geq 2$, and $z \geq 2$, and wherein said etching comprises forming a critical dimension of the semiconductor device between approximately 50 angstroms and approximately 300 angstroms.

2. The method of claim 1, wherein said $C_xH_yF_z$ comprises $C_2H_2F_4$.

3. The method of claim 1, wherein said etch chemistry further comprises $CF_4$ and $CHF_3$.

4. The method of claim 1, wherein said etch chemistry has a dielectric layer:barrier layer etch selectivity of at least approximately 20:1.

5. The method of claim 1, wherein said etch chemistry has a dielectric layer:barrier layer etch selectivity of approximately 20:1 to approximately 50:1.

6. The method of claim 1, wherein said dielectric layer comprises an interlevel dielectric layer.

7. The method of claim 1, wherein said dielectric layer comprises an oxide.

8. The method of claim 1, wherein said barrier layer comprises a metal alloy.

9. The method of claim 1, wherein said barrier layer comprises a material selected from the group consisting of titanium, titanium nitride, and titanium tungsten.

10. The method of claim 1, wherein said barrier layer has a thickness of approximately 100 angstroms to approximately 150 angstroms.

11. The method of claim 1, wherein said etching the dielectric layer terminates upon exposing an upper surface of the barrier layer.

12. The method of claim 1, it wherein said etching comprises etching the dielectric layer from an upper surface of the dielectric layer to an upper surface of the barrier layer.

13. A method for forming a contact opening, comprising:
depositing a dielectric layer upon a barrier layer; and
etching said dielectric layer with an etch chemistry comprising $C_2H_2F_4$, $CF_4$, and $CHF_3$, wherein said etching comprises:
introducing $C_2H_2F_4$ at a flow rate between approximately 2 sccm and approximately 8 sccm;
introducing $CF_4$ at a flow rate between approximately 10 sccm and approximately 60 sccm; and
introducing $CHF_3$ at a flow rate between approximately 30 sccm and approximately 100 sccm.

14. The method of claim 13, wherein said etch chemistry has a dielectric layer:barrier layer etch selectivity of at least 20:1.

15. The method of claim 13, wherein said barrier layer has a thickness of approximately 100 angstroms to approximately 150 angstroms.

16. The method of claim 13, wherein said barrier layer comprises a material selected from the group consisting of titanium, titanium tungsten, and titanium nitride.

* * * * *

UNITED STATES PATENT AND TRADEMARK OFFICE
CERTIFICATE OF CORRECTION

PATENT NO. : 6,693,042 B1
DATED : February 17, 2004
INVENTOR(S) : Sedigh et al.

It is certified that error appears in the above-identified patent and that said Letters Patent is hereby corrected as shown below:

Column 14,
Line 29, after the phrase "of claim 1," please delete the word "it."

Signed and Sealed this

Seventh Day of September, 2004

JON W. DUDAS
*Director of the United States Patent and Trademark Office*